(12) United States Patent
Barnette et al.

(10) Patent No.: US 8,469,724 B1
(45) Date of Patent: Jun. 25, 2013

(54) BUS BAR FOR POWER DISTRIBUTION ON A PRINTED CIRCUIT BOARD

(75) Inventors: Jamaica L. Barnette, Durham, NC (US); Raymond M. Clemo, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/340,808

(22) Filed: Dec. 30, 2011

(51) Int. Cl.
   *H01R 25/00* (2006.01)

(52) U.S. Cl.
   USPC .......................................................... 439/86

(58) Field of Classification Search
   USPC ..................................... 439/86, 91
   See application file for complete search history.

(56) References Cited

U.S. PATENT DOCUMENTS

| | | | |
|---|---|---|---|
| 5,229,624 A * | 7/1993 | Marks | 257/40 |
| 6,010,220 A | 1/2000 | Smarto | |
| 6,213,602 B1 | 4/2001 | Smarto | |
| 6,400,559 B1 | 6/2002 | Kohler et al. | |
| 6,644,098 B2 | 11/2003 | Cardinale et al. | |
| 7,104,804 B2 * | 9/2006 | Batinovich | 439/71 |
| 7,229,575 B2 | 6/2007 | Wang et al. | |
| 7,699,635 B2 * | 4/2010 | Weaver et al. | 439/291 |
| 2004/0075395 A1 * | 4/2004 | Antoniadis et al. | 315/169.1 |
| 2005/0270056 A1 * | 12/2005 | Rumbaugh | 324/765 |
| 2007/0059901 A1 * | 3/2007 | Majumdar et al. | 438/455 |
| 2007/0068929 A1 * | 3/2007 | Augustine et al. | 219/529 |
| 2008/0121899 A1 * | 5/2008 | Pires et al. | 257/88 |
| 2008/0196757 A1 | 8/2008 | Yoshimine | |
| 2010/0277065 A1 * | 11/2010 | Park et al. | 313/509 |
| 2011/0151315 A1 | 6/2011 | Masson et al. | |
| 2012/0300280 A1 * | 11/2012 | Murphy et al. | 359/275 |

* cited by examiner

*Primary Examiner* — Gary F. Paumen
(74) *Attorney, Agent, or Firm* — Cynthia G. Seal; Jeffrey L. Streets

(57) ABSTRACT

A bus bar distributes power to a plurality of electronic components supported on a printed circuit board. One embodiment of the bus bar comprises a plurality of compressible contact pads made from an electronically conductive polymer, spaced along the bus bar for contacting conductive contacts that are coupled to a power domain or individual electronic component. The pads may be secured to the bus bar and the conductive traces using an electronically conductive epoxy adhesive. Rivets may then be used to secure the bus bar to the printed circuit board and compress the pads, which conform to the printed circuit board to make a reliable electrical connection with the conductive traces. The bus bar further comprises a plurality of current sense points disposed adjacent to the pads for measuring the amount of current provided to each power domain.

20 Claims, 7 Drawing Sheets

BUS BAR FOR POWER DISTRIBUTION ON A PRINTED CIRCUIT BOARD

BACKGROUND

1. Field of the Invention

The present invention relates to distributing power to electronic components on a printed circuit board.

2. Background of the Related Art

Many commercially produced electronic devices include printed circuit board assemblies. A printed circuit board (PCB) comprises a non-conductive substrate that supports electronic components that are interconnected using conductive pathways etched from copper sheets laminated onto the PCB substrate. Electronic components on a PCB that require a large amount of current may have a conductive pathway with an increased number of layers, a heavier copper weight, a decreased pathway length, an increased pathway width or some combination of these features to conduct the required current to the electronic component without excessive heat caused by electrical resistance. However, due to staggering increases in the cost of copper, the cost of a PCB increases substantially if the PCB includes power distribution pathways with more layers, greater copper weight or increased pathway width in order to provide the required current to the electronic components.

An internal plane is a conductive layer disposed within the PCB substrate to carry current to vias formed in the PCB. Vias are plated through-holes in the PCB that are used to connect conductive pathways or electronic components on either side of the substrate to current-carrying internal plains. Power planes, ground planes, and the vias used to supply current from an internal power plane within the substrate to conductive pathways or electronic components on the sides of the PCB make up a large portion of the copper used in a PCB. As sophisticated electronic components increase the demand for power in the PCB, the population of vias and pathways on a PCB causes increased resistance to current flow and the generation of an excessive amount of heat. This increased amount of electrical resistance impairs the voltage available to the electronic components through the internal planes, vias and pathways on the PCB.

Where the cost of conductive material (copper) and/or the resistance to current flow become excessive, bus bars have been utilized to deliver sufficient power to current-consuming electronic components on the PCB. A bus bar is an electrically-conductive member that receives electrical current from a current source and distributes the current to the plurality of electronic components on the PCB. A bus bar is generally larger than an internal plane and takes up real estate on the PCB, but imposes considerably less resistance to current flow than do thin internal plains disposed in layers within the PCB substrate.

However, interfacing a bus bar to a PCB board is challenging. Soldering the bus bar to the PCB is impractical because a large amount of heat is needed to melt the solder to provide a conductive contact, and the heat produced by a soldering iron (or a soldering "gun") may cause thermal damage to sensitive electronic components on the PCB. The obstacles to soldering are exacerbated by the high thermal conductivity of the bus bar, which causes a large portion of the heat provided to a solder point to be dissipated. As a result, an even greater amount of heat is required in order to melt the solder. Even if a suitable connection between the bus bar and the PCB can be made, the differences in the thermal expansion coefficients of the pathway material (copper), the solder material (tin and sometimes lead) and the bus bar material (copper and aluminum) will undergo different amounts of thermal expansion. Cyclic heating and cooling of the connection, due to variations in the current flow through the connection, promotes cyclic stress cracking and ultimately failure of the electrical contact.

Alternatively, a bus bar may be interfaced with a power sub-domain on a PCB using a screw terminal with a screw threadably received in a base to capture an extension from the bus bar against an extension from the PCB power sub-domain between the base and a head on the screw, and to hold these extensions in conductive contact one with the other. However, screw terminals may be compromised by vibrations and/or by the cyclic thermal stresses that cause the screw to gradually back out from the base or the extensions and to become dislodged from firm conductive contact one with the other. Also, screw terminals take up precious space on the PCB.

For optimal PCB management, it is useful to determine the rate of power consumption by each power sub-domain, each electronic component or each grouping of electronic components on a PCB. Current sense elements are devices that can be installed on discrete conductive pathways on a PCB to measure the current flowing to a power sub-domain or through an electrical contact of interest. Unfortunately, conventional current sense elements consume valuable space on the PCB and impose resistance to current flow through the contact that is being monitored by the current sense element. The result is unwanted heat and increased resistance of adjacent components. Low-resistance (less than 0.001 ohm) current sense elements may be used, but these devices are very costly and typically exhibit unacceptably large tolerances that may lead to inaccurate current measurements.

BRIEF SUMMARY

One embodiment of the present invention provides an apparatus, comprising a rigid, electronically conductive bus bar, and a plurality of electronically conductive polymer contact pads secured to the bus bar and spaced apart along the length of the bus bar, wherein the plurality of electronically conductive polymer contact pads are compressible.

Another embodiment of the invention provides a system, comprising a printed circuit board supporting a plurality of electronic components, wherein each of the electronic components are electrically connected to one of a plurality of electronically conductive contacts disposed in a linear arrangement on the printed circuit board. A rigid, electronically conductive bus bar extends over the plurality of electronically conductive contacts. The bus bar has a plurality of electronically conductive polymer contact pads secured to the bus bar and spaced apart along the length of the bus bar. One or more fasteners secure the bus bar to the printed circuit board, wherein the one or more fasteners compress each of the plurality of electronically conductive polymer contact pads into contact with one of the plurality of electronically conductive contacts.

DETAILED DESCRIPTION

Figure 1:
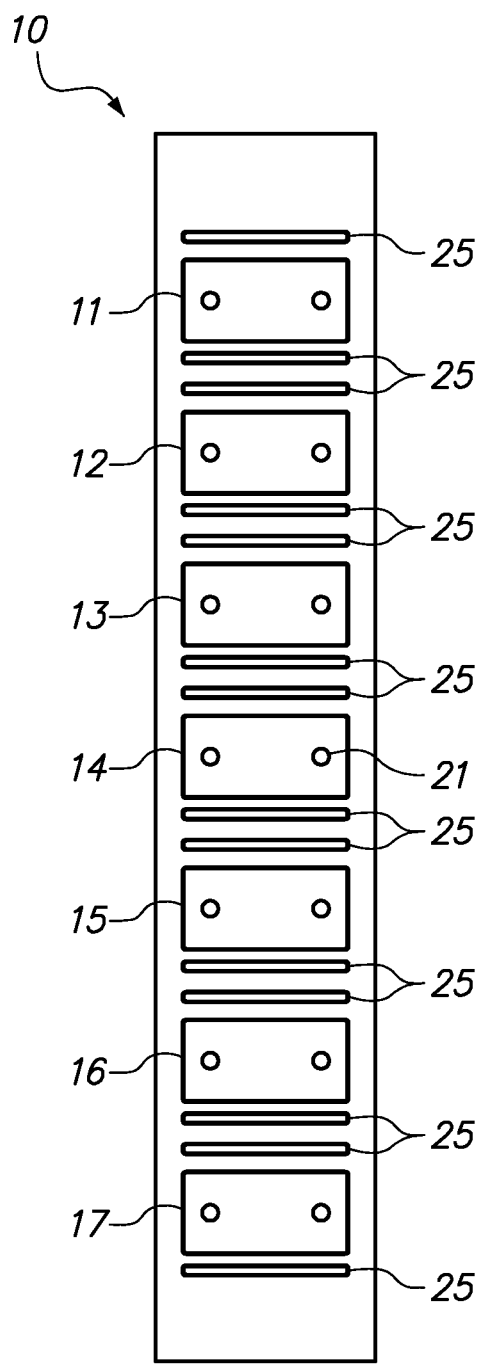
FIG. 1 a bottom plan view of an embodiment of a bus bar in accordance with the present invention for power distribution on a printed circuit board (PCB).

One embodiment of the present invention provides an apparatus, comprising a rigid, electronically conductive bus bar, and a plurality of electronically conductive polymer contact pads secured to the bus bar and spaced apart along the length of the bus bar, wherein the plurality of electronically conductive polymer contact pads are compressible. Accordingly, the bus bar provides an improved electrical connection between the bus bar and a plurality of contacts on a printed circuit board (PCB). Power distribution across the PCB to various power domains or individual electronic components is thus improved.

The bus bar may, in one embodiment of the present invention, be coupled to the PCB using rivets to ensure a reliable, low-profile connection there between while allowing the connection to "breathe," or to expand and contract with changes in temperature without affecting the reliability of the connection. However, it is still preferable to adhere the electronically conductive polymer contact pads to the bus bar, for example by using an electrically conductive epoxy adhesive. The bus bar may be secured to the back side or the top side of the PCB using rivets.

In one embodiment of the present invention, the use of the electrically conductive polymer contact pad provides a favorable electrical connection to enable the use of the bus bar and conductive polymer sense points for highly accurate current sensing. The elastic polymer of the sense points may extended into contact with additional contacts on the PCB to be used as Kelvin sense points.

The method of the present invention enables an accurate determination of the resistance through which a measured voltage drop occurs. Accordingly, the method may determine the current flowing through defined portions of the bus bar and to power sub-domains on the PCB that receive current from the bus bar. Instead of having numerous isolated and space-consuming Kelvin sense elements on the PCB that can lead to error in current measurements, the current sense elements can be conveniently and centrally placed on the bus bar. The rate of current flow to any given electrical component can be determined by measuring the potential between any two current sense points on the bus bar and using a known resistance of the bus bar to determine the current. An overall balance of current is achieved by equating current flow into the bus bar to current flow out of the bus bar to the electrical components on the PCB, and calibrating each of the current sensors so this balance is maintained.

The electronically conducting polymer can be any known composition. A non-limiting list of examples includes polypyrrole, polyaniline, and composites containing conductive elements such as a metal. The electrical conductivity of the electronically conducting polymer pad may be increased further by electroplating a metal onto the surface of the pad. This will also server to facilitate soldering of the polymer, if desired.

In another embodiment of the method of the present invention, the bus bar may be measured during manufacture and the data from the measurements can be stored on a face plate or on a readable RFID device for retrieval and use in determining current flow to electronic components on the PCB. This method gives the bus bar its own unique electronic "fingerprint" or resistance identity, thus eliminating the need to scrap or trim components.

In one embodiment of the present invention, a database of resistance values for segments of the bus bar at varying temperatures can be obtained experimentally and stored on a face plate or, alternately, on a readable RFID device for retrieval and use in determining current flow to electronic components on the PCB. These resistance values can be used to determine the amount of current being provided to each electronic component or to each power sub-domain on the PCB that is electrically coupled to the bus bar as a source of current.

In a further embodiment of a method of measuring current distribution to electronic components on a PCB, the accuracy of current measurements may be improved by measuring the resistance of each sub-resistor element of the bus bar during its manufacture, and by then recording the measured resistance of each sub-resistor element on the bus bar for later use in calculating current distribution rates. In one embodiment, a face plate may be secured to the bus bar to provide this measured resistance data. Alternately, the measured resistance of the sub-resistor elements may be electronically stored on a RFID-type readable device embedded on the bus bar for subsequent retrieval by an RFID reader. The RFID reader may retrieve the measured resistance of each sub-resistor element or of the sub-resistor element(s) of interest and electronically provide that data to a processor for calculation of the current flow to the related electronic components or the related power domain.

Using embodiments of this method, unprecedented current measurement accuracies can be achieved without the use of tolerance bands to determine worst-case values for millions of units. The Kelvin sense points are used for the current measurement. The Kelvin sense points are created by placing or depositing an electronically conductive polymer to the bus bar on opposing sides of the pad. These sense points may be compressed against conductive contacts or traces that lead to a current sense amplifier.

Figure 7:
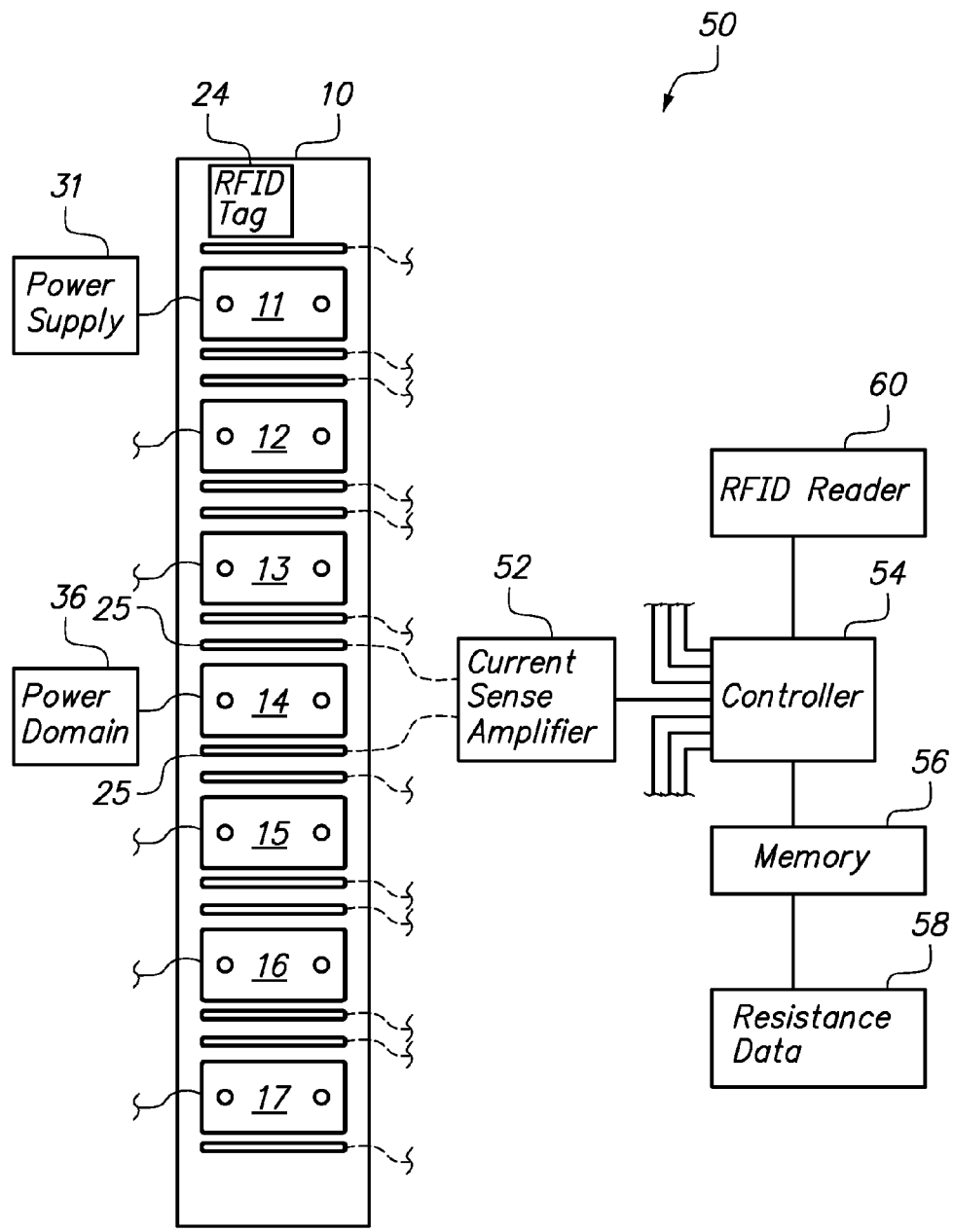
FIG. 7 is a system diagram for a system that monitors the current through the bus bar from a power supply to a power domain.

The most important limiting factor in the accuracy of current sensing in any device is the resistance of the element that is being measured. Resistive measurements of the bus bar can be acquired and accurately modeled with respect to current load, as seen in FIG. 7, provide less than 1% error in the current measurement. Data regarding the resistive measurements enables highly accurate current measurements.

In a further embodiment, a first contact pad is in contact with an input from a power supply. This first contact pad preferably utilizes an electronically conductive contact pad made from a composition having lower resistance than the compositions used to form the other contact pads. For example, the composition of the first contact pad may include silver coated aluminum micro beads mixed into the conductive polymer. Since the first contact pad carries the total sum of the currents to all components in the device, a very low resistance will combat power dissipation within the system. The other contact pads on the bus bar may include other conductive, but less expensive, materials such as nickel graphite. These distributed contact pads process considerably less current, such that the somewhat higher resistance dissipates less power.

Since all of the current into and out of the bus bar passes through one of the contact pads, special care should be taken to adhere the conductive pad to the bus bar or the PCB. Specifically, in high current applications, power dissipation can be significant if connection between the contact pad and either the bus bar or the printed circuit board has an undesirable resistance path. The surfaces of the bus bar and printed circuit board should be kept clean when adhering the contact pad so that the main current carrying surface area will be unobstructed. The contact pads may have any thickness, but are preferably just a few tenths of a millimeter thick.

To obtain good current sense information, a technique called Kelvin sensing is used. This involves adding a non-current carrying connection to the bus bar in the form of tiny elastomeric pads. These pads are then connected to the inputs to a current sense amplifier.

A power sub-domain on the PCB may include, for example, one or more current-consuming electronic components such as a processor, a bank of dual in-line memory modules (DIMMs), or both. Favorable PCB management requires the knowledge of the rate of current drawn by the processor and/or the bank of DIMMs within the power sub-domain.

In this implementation each polymeric pad is used to isolate several different power domains within one total server based system, to the point of utilizing one contact pad for each CPU and memory subsystem. With the bus bar sounded connected to the PCB, the bus bar can be used as an effective current measuring shunt, thus replacing other current sensing devices within the system, cutting cost and complexity. The current distributing pads are placed evenly throughout the length of the bus bar. Due to the tight tolerance of dimensions of a solid metal bus bar, the resistance of the bus bar can yield accurate current information.

In another embodiment of the method of the present invention, the bus bar is subjected to resistance measurements during manufacture to provide improved resistivity data that can be subsequently used to determine the rate of current flow through the bus bar to power sub-domains on a PCB. A known current may be applied across a tested portion of the bus bar and the resulting voltage drop measured. The effective resistance may be achieved by ramping a known current to some predisposed current. These infinitesimal current steps are used to characterize the voltage drop across the array of Kelvin Sense point on the bus bar with the change in current. This current flows from one end of bus bar to the other, exposing each set of sense points to exact current. These voltage drops are measured and plotted, and exponential curves are obtained. These curves are curve fitted to obtain a best fit curve which can be used to estimate the effective resistance any load point.

Device manufactures supply engineers with a tolerance range that directly reflect the quality of their manufacturing process. This tolerance band is used to make sure those individual parts can be used within a design. Typically the tighter the tolerance is on devices the more industrial waste the manufacture must account for. Using the Average Resistance or the Standard deviation equation can lead to poor accuracy at any points that fall out that resistive range.

FIG. 1 a bottom plan view of an embodiment of a bus bar in accordance with the present invention for power distribution on a printed circuit board (PCB). The bus bar 10 may, for example, comprise a highly conductive metal such as copper-aluminum alloy. The dimensions of embodiments of the bus bar of the present invention may vary. The height of the bus bar may be limited by spacing requirements within a server chassis, but the width of the bus bar 10 may be adjusted as needed to provide the desired current carrying capacity. Once designed, the dimensions of the bus bar may be made extremely accurately.

As shown in FIG. 1, the bus bar 10 comprises a plurality of conductive elastomeric polymer pads 11-17 coupled in an equally-spaced arrangement to a first side 20 of the bus bar 10. The bus bar receives current from a power supply 31 and distributes that current through the bus bar 10 to the contact pads 11-17, which then can pass current to electronic components on the PCB, such as a processor or a dual in-line memory module ("DIMM"), disposed within a sub-power domain (not shown) on a PCB (not shown). The contact pads 11-17 serve to facilitate conductive connections between the bus bar 10 and conductive pathways on the PCB.

Figure 2:
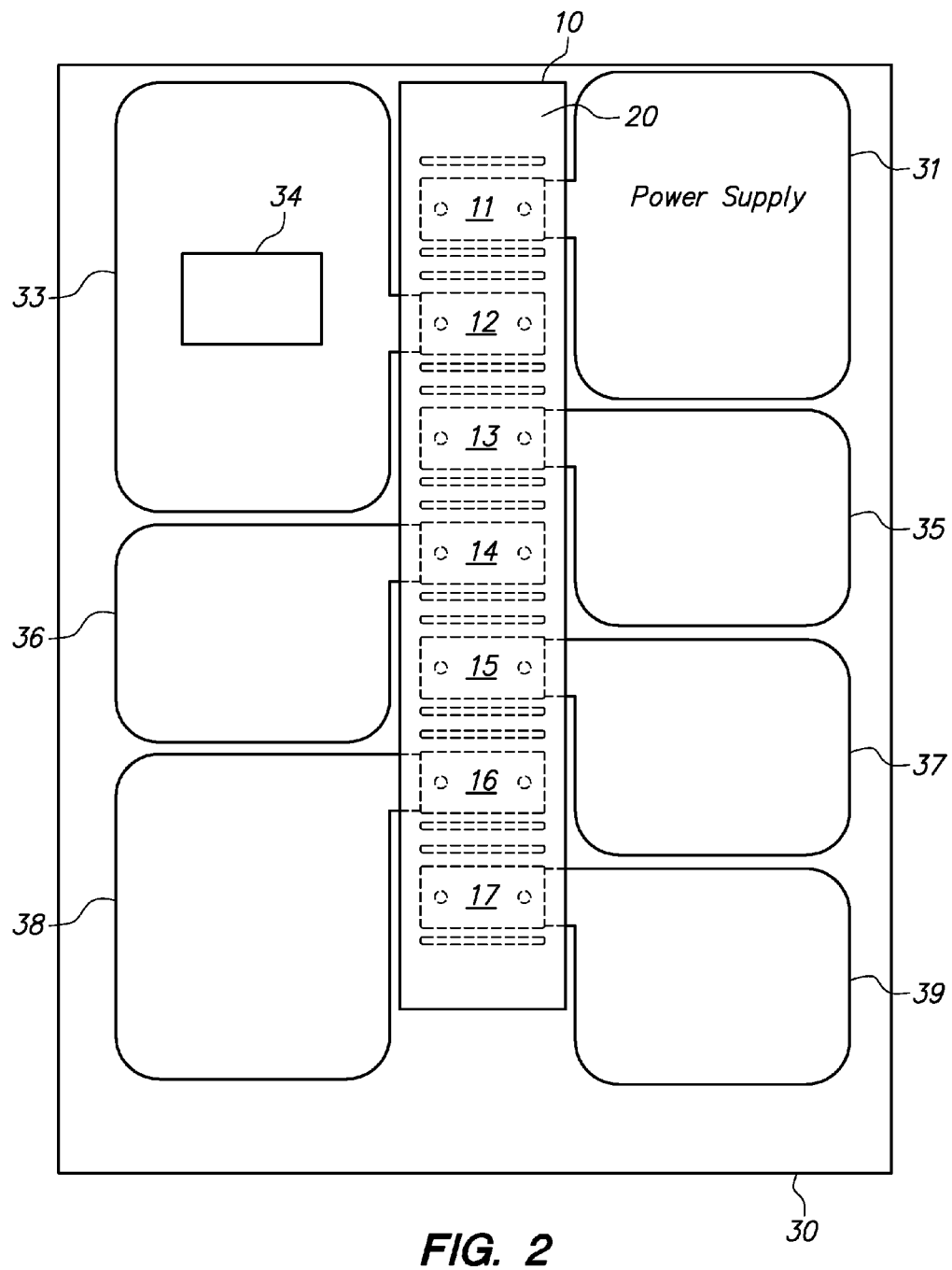
FIG. 2 is a plan view of a PCB having several power domains disposed in electrical communication with the bus bar.

FIG. 2 is a plan view of an embodiment of a PCB 30 on which the bus bar 10 of FIG. 1 is coupled. The first contact pad 11 on the bus bar 10 is placed in contact with a conductive contact coupled to a power supply 31. The sum of all current into the bus bar for distribution to the power domains passed through this first contact pad 11. Current then flows through the bus bar 10 to each of the other contact pads 12-17. For example, contact pad 12 is in electrical contact with a power domain 33 that provides current to a processor 34. The remaining pads 13-17 are positioned along bus bar 10 such that current flows from the contact pads 13-17 to adjacent power domains 35-39 through the shortest available conductive pathways. The first pad 11 preferably includes a very highly conductive material, such as silver-coated aluminum. The remaining pads 12-17 carry only a fraction of the total current flowing into the bus bar 10 and a cost savings may be obtained by using a material having a somewhat lower, but still suitable, conductivity at a more reasonable cost such as, for example, nickel or graphite.

With a favorable electrical connection between the bus bar 10 and the PCB 30, the bus bar 10 may also be used as a current measuring shunt to replace discrete current sense resistors. During calibration, a potentiometer may be used to measure the resistance across each pair of current sense points 25 on the bus bar 10 of FIG. 1 and the resistance values may be recorded. These resistance values can be used during actual power distribution to yield accurate current measurements. The result is lower cost and lower complexity of the power distribution and measurement system.

It should be understood that the positioning of the pads 11-17 along the bus bar 10 may benefit the overall power distribution efficiency of the bus bar 10, and the pads 11-17 are preferably positioned along the bus bar 10 to provide the shortest available pathway between any given pad and the power domain or electronic components that receive current from that pad.

Figure 3:
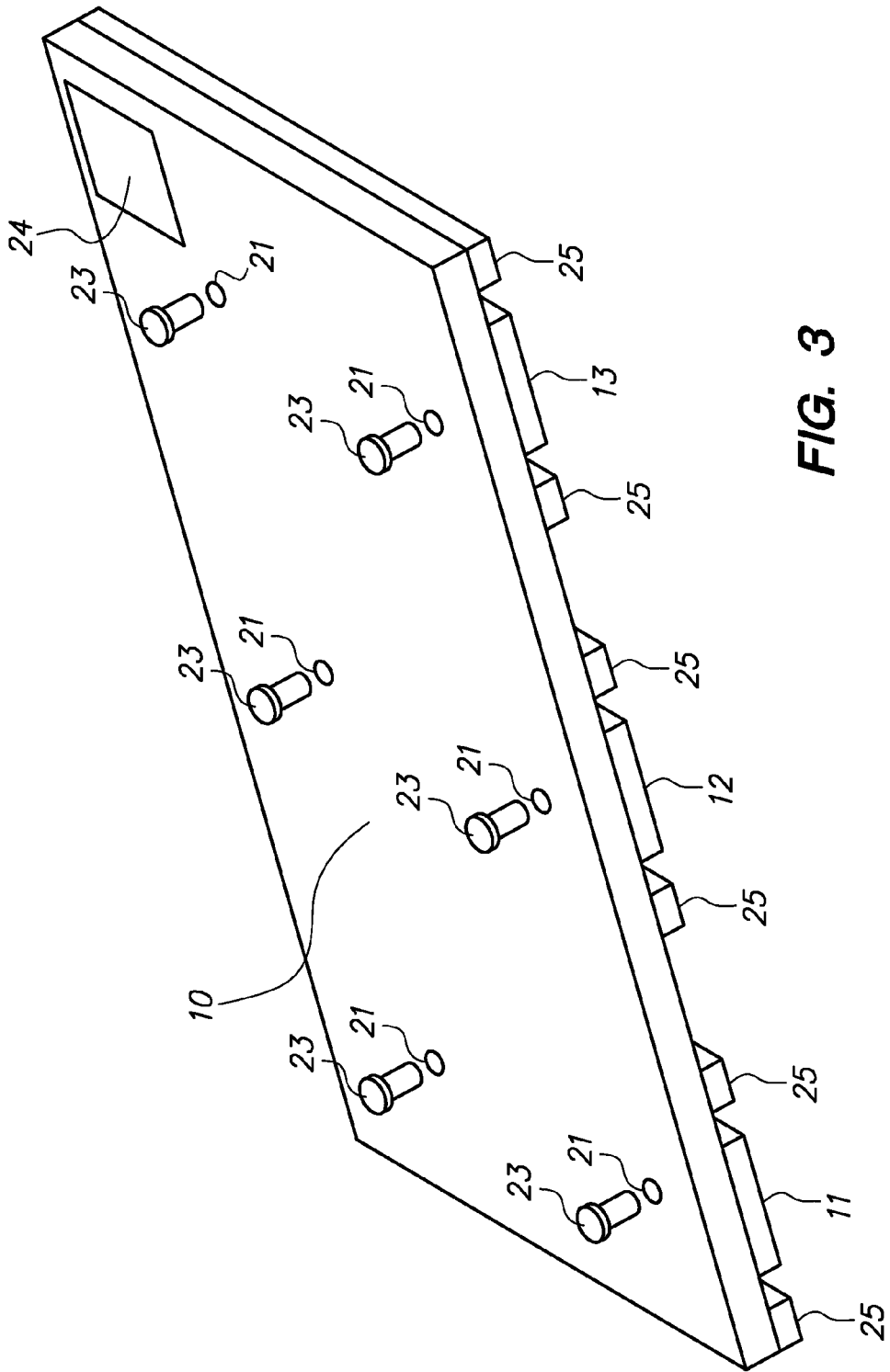
FIG. 3 is a perspective view of the bus bar.

FIG. 3 is a perspective view of a portion of the bus bar 10. The portion shown includes three of the contact pads 11-13 and the current sense points 25 associated with each of these contact pads. The bus bar 10 also has a plurality of holes 21, where each hole is sized for receiving a rivet 23 and positioned to compress the contact pads. The bus bar also includes an RFID tag 24 that stores resistance data about the bus bar.

Figure 4:
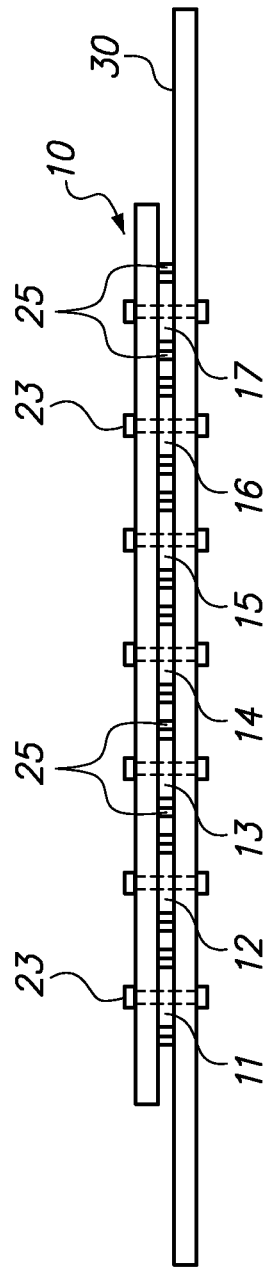
FIG. 4 is a side view of the bus bar secured to the PCB with rivets.

FIG. 4 is a side view of the bus bar 10 secured to the PCB 30 with rivets 23. Each rivet 23 has a first head securing the bus bar and a second head securing the printed circuit board. When secured, the rivet 23 compresses the contact pad between the bus bar and the printed circuit board, such that an electrical connection is established between the bus bar and a conductive contact on the printed circuit board. The amount of pressure applied by the rivets is a function of the length of the rivets 21 used to secure the pads 11-17 to the bus bar 10, and the thickness of the bus bar, contact pads, and printed circuit board. These thicknesses may vary with temperature, but the compressible contact pads are able to compress further and/or relax in order to maintain a good electrical connection. The engagement between the contact pad and the bus bar can withstand cyclic stresses caused by repeated heating and cooling due to varying current and other factors. Being that the conductive elastomeric polymer of the contact pads is generally compressible, the bus bar, the contact pad and the PCB are allowed by the riveted connections to expand and contract without disturbing the connections there between.

Figure 5:
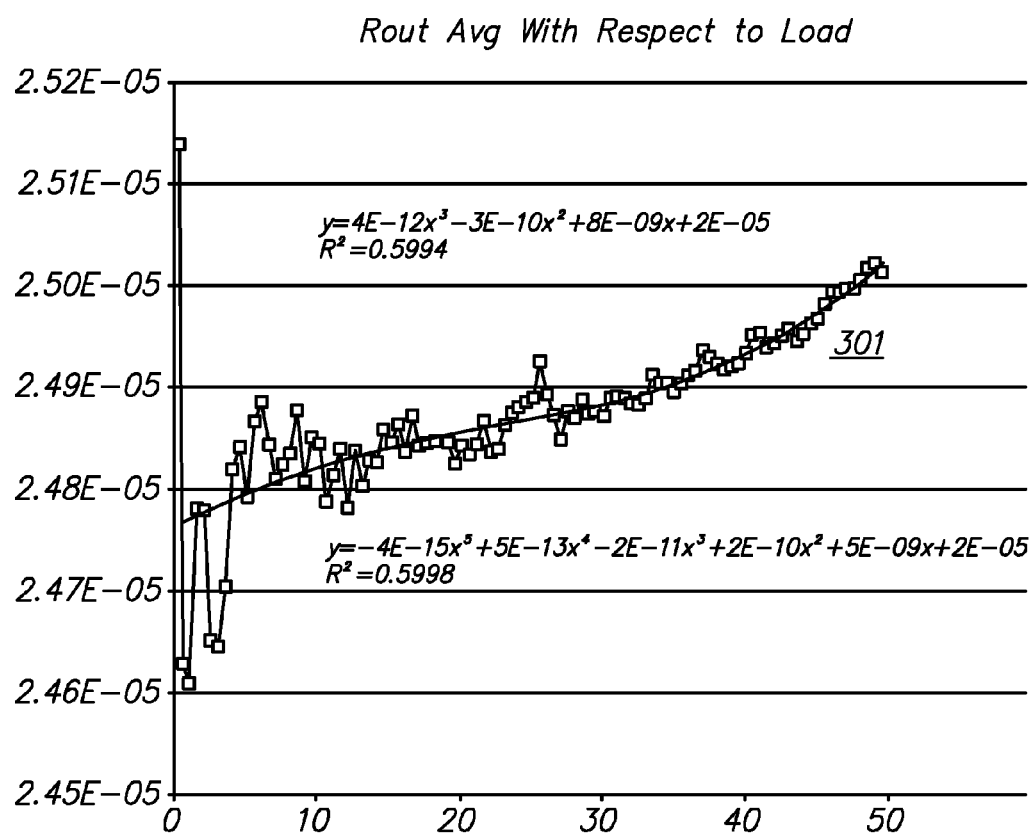
FIG. 5 is a graph of resistance in the bus bar as a function of the load.

FIG. 5 is a graph of resistance in the bus bar as a function of the load. In one example, the resistance of the bus bar between two current sense points was measured at current loads varying from zero to 50 Amps. For the resistance measurement in FIG. 5, the resistance is determined to be about 24.8 microOhms at low current, but increases to over 15.0 microOhms at 50 Amps.

Figure 6:
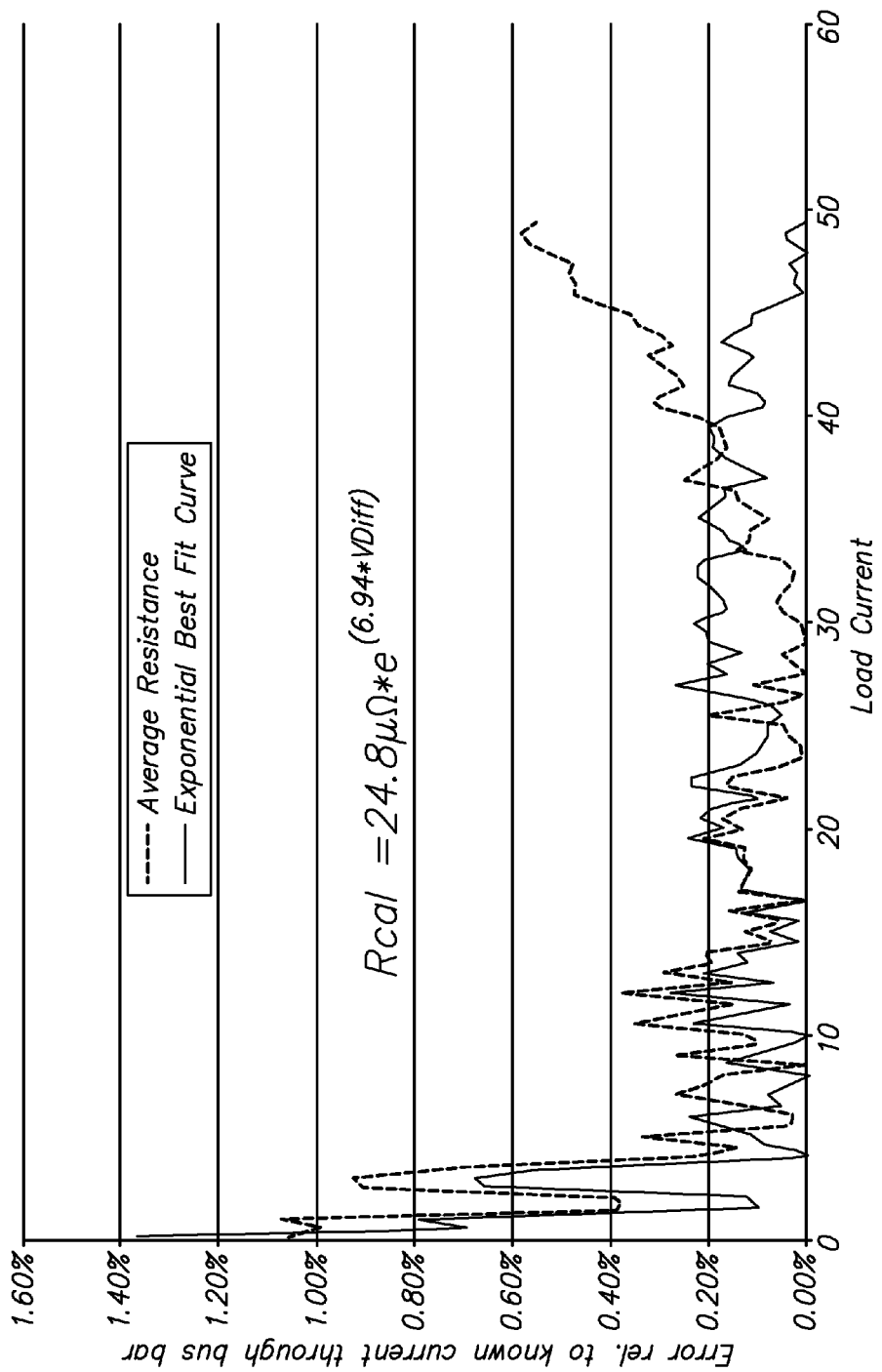
FIG. 6 is a graph of current measurement error as a function of the load current using the bus bar as a current sense element and calculating the current on the basis of either the average resistance between the Kelvin sense points (dashed line) or a calibrated resistance determined by an exponential best fit curve (solid line).

FIG. 6 is a graph of current measurement error as a function of the load current using the bus bar as a current sense element and calculating the current on the basis of either the average resistance between the Kelvin sense points (dashed line) or a calibrated resistance determined by an exponential best fit curve (solid line). As shown, the percent error in the current sensed using the calibrated resistance data is less than 0.3.

Using the effective resistance of a sub domain (i.e., 24.8 microOhms) between the Kelvin sense points, and the exponential term (i.e., $e^{(6.94*VDiff)}$) for the increase of the resistance of the bar with respect to increased voltage drop across the Kelvin Sense Points ($V_{Diff}$), to calculate current information can lead to extremely high accuracy parts. This resistive calibration can be yield accuracy measurement well below 1%, as experientially shown in FIG. 6.

This type of accuracy is unique to the bus bar of the present invention. This type of calibration can be with the quality testing of the device, and the resistive information can be, for example, either etched into the outward encasing material, or stored in an RFID type of device, which is designed right into the encasing of the busbar (401). Using an RFID type of device, the data can be easily stored, written and read by an RFID reader. In most devices for current measurement, the bottle neck for DC current measurement accuracy fall to the accuracy of the resistive element. Implementing the present bus bar measurement architecture, the limit on DC current measurement accuracy is the voltage resolution of the current sense amplifier.

FIG. 7 is a system diagram for a system 50 that monitors the current through the bus bar 10 from a power supply 31 to a power domain 36. The bus bar 10 is coupled to the power supply 31 through the first contact pad 11 and the power domain 36 is coupled to the bus bar through the fourth contact pad 14. The current to the power domain 36 is measured using the first and second sense points 25 adjacent the contact pad 14. These sense points 25 are electronically coupled to a current sense amplifier 52, which provides its output to a controller 54. The controller 54 has access to a memory device 56 that stores resistance data 58, which was previously generated using actual resistance measurements for the bus bar 10 and modeling those resistance measurements as shown in FIGS. 5 and 6. Originally, the controller 54 may obtain the resistance data from the RFID tag 24 using an RFID reader 60. The resistance data read in this manner may then be stored in the memory 56 for subsequent use. Accordingly, the resistance data can be generated by a manufacturer of the bus bar and automatically provided to the controller. In an actual system, there would be a current sense amplifier for each of the contact pads 11-17, so that the current from the power supply 31 and to each power domain can be monitored. Other power domains and other current sense amplifiers were omitted from FIG. 7 for clarity.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but it is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. An apparatus, comprising:
a rigid, electronically conductive bus bar;
a plurality of electronically conductive polymer contact pads secured to the bus bar and spaced apart along the length of the bus bar, wherein the plurality of electronically conductive polymer contact pads are compressible.

2. The apparatus of claim 1, wherein the plurality of electronically conductive polymer contact pads are secured to the bus bar with an electronically conductive adhesive.

3. The apparatus of claim 1, further comprising:
a plurality of fasteners for securing the bus bar to a printed circuit board and compressing the electronically conductive polymer contact pads against contacts on the printed circuit board.

4. The apparatus of claim 1, further comprising:
first and second current sense points secured to the bus bar on opposing sides of each electronically conductive polymer contact pad.

5. The apparatus of claim 4, wherein the current sense points include an electronically conductive polymer material.

6. The apparatus of claim 1, wherein a first pad of the plurality of electronically conductive polymer contact pads comprises a composition having a lower electrical resistance than the other electronically conductive polymer contact pads, wherein the first pad forms an input for contact with a power supply input contact.

7. The apparatus of claim 6, wherein the composition of the first pad comprises aluminum microbeads coated with silver.

8. The apparatus of claim 4, further comprising:
an RFID tag secured to the bus bar, wherein the RFID tag stores data about the resistance of the bus bar between the first and second current sense points on opposing sides of each of the electronically conductive polymer contact pads.

9. The apparatus of claim 1, wherein the plurality of electronically conductive polymer contact pads are equally spaced along the length of the bus bar.

10. A system, comprising:
a printed circuit board supporting a plurality of electronic components, wherein each of the electronic components are electrically connected to one of a plurality of electronically conductive contacts disposed in a linear arrangement on the printed circuit board;
a rigid, electronically conductive bus bar extending over the plurality of electronically conductive contacts;
a plurality of electronically conductive polymer contact pads secured to the bus bar and spaced apart along the length of the bus bar, wherein the plurality of electronically conductive polymer contact pads are compressible; and one or more fasteners securing the bus bar to the printed circuit board, wherein the one or more fasteners compress each of the plurality of electronically conductive polymer contact pads into electrical contact with one of the plurality of electronically conductive contacts on the printed circuit board.

11. The system of claim 10, wherein the plurality of electronically conductive polymer contact pads are secured to the bus bar with an electronically conductive adhesive.

12. The system of claim 10, further comprising:
first and second current sense points secured to the bus bar on opposing sides of each electronically conductive polymer contact pad.

13. The system of claim 12, wherein the current sense points include an electronically conductive polymer material.

14. The system of claim 10, further comprising:
a power supply providing power to a power supply contact on the printed circuit board, wherein a first pad of the plurality of electronically conductive polymer contact pads comprises a composition having a lower electrical resistance than the other electronically conductive polymer contact pads, wherein the first pad forms an input for contact with the power supply contact.

15. The system of claim 14, wherein the composition of the first pad comprises aluminum microbeads coated with silver.

16. The system of claim 14, wherein the composition of the other electronically conductive polymer contact pads comprise nickel graphite.

17. The system of claim 12, further comprising:
an RFID tag secured to the bus bar, wherein the RFID tag stores data about the resistance of the bus bar between the first and second current sense points on opposing sides of each of the electronically conductive polymer contact pads.

18. The system of claim 10, wherein the plurality of electronically conductive polymer contact pads are equally spaced along the length of the bus bar.

19. The system of claim 10, wherein the fasteners are rivets, wherein each rivet extends through a hole in the bus bar and a hole through the printed circuit board.

20. The system of claim 10, further comprising:
a controller in electronic communication with the first and second current sense points, wherein the controller has access to a database storing predetermined resistance parameters for the bus bar between the first and second current sense point, and wherein the controller executes control logic to determine the current passing through each of the plurality of electronically conductive contact pads.

* * * * *